(12) United States Patent
Gwon et al.

(10) Patent No.: US 12,259,742 B2
(45) Date of Patent: Mar. 25, 2025

(54) LOW-DROPOUT REGULATOR

(71) Applicant: Samsung Electronics Co., Ltd., Suwon-si (KR)

(72) Inventors: Huidong Gwon, Yongin-si (KR); Byongdeok Choi, Seoul (KR); Taehwang Kong, Suwon-si (KR); Junhyeok Yang, Seoul (KR); Junhwan Jang, Seoul (KR)

(73) Assignees: SAMSUNG ELECTRONICS CO., LTD., Suwon-si (KR); IUCF-HYU (INDUSTRY-UNIVERSITY COOPERATION, Seoul (KR)

( * ) Notice: Subject to any disclaimer, the term of this patent is extended or adjusted under 35 U.S.C. 154(b) by 229 days.

(21) Appl. No.: 17/994,134

(22) Filed: Nov. 25, 2022

(65) Prior Publication Data

US 2023/0170800 A1     Jun. 1, 2023

(30) Foreign Application Priority Data

Dec. 1, 2021   (KR) .................. 10-2021-0170242

(51) Int. Cl.
*G05F 1/59*      (2006.01)
*G05F 1/575*    (2006.01)
(Continued)

(52) U.S. Cl.
CPC .............. *G05F 1/59* (2013.01); *G05F 1/575* (2013.01); *H03M 1/0607* (2013.01); *H03M 1/44* (2013.01); *H03M 1/502* (2013.01); *H02M 3/157* (2013.01)

(58) Field of Classification Search
CPC .......... G05F 1/575; G05F 1/59; H02M 3/157; H03M 1/0607; H03M 1/44; H03M 1/502
See application file for complete search history.

(56) References Cited

U.S. PATENT DOCUMENTS 8,031,027 B2   10/2011   Park et al.
8,598,854 B2   12/2013   Soenen et al.
(Continued)

FOREIGN PATENT DOCUMENTS

KR    1020040086404 A    10/2004
KR    1020090014594 A    2/2009
(Continued)

OTHER PUBLICATIONS

Jianming Zhao, et al. "A 310-nA Quiescent Current 3-fs-FoM Fully Integrated Capacitorless Time-Domain LDO With Event-Driven Charge Pump and Feedforward Transient Enhancement", IEEE Journal of Solid-State Circuits, vol. 56, No. 10, Oct. 2021.
(Continued)

*Primary Examiner* — Jue Zhang
(74) *Attorney, Agent, or Firm* — Muir Patent Law, PLLC

(57) ABSTRACT

An LDO regulator includes a voltage-to-time converter configured to convert a fluctuation in an output voltage sensed from an output node into a time domain signal having a pulse type, and output the time domain signal, based on a clock signal; a time-to-voltage converter configured to receive the time domain signal, convert the time domain signal into a first voltage control signal performing first compensation for the output voltage, and output the first voltage control signal; an analog amplifier configured to output a second voltage control signal continuously performing second compensation for the output voltage, regardless of the clock signal; and a first pass transistor configured to drive the output voltage based on the second voltage control signal. The LDO regulator is configured to reduce the fluctuation in the output voltage, based on the first compensation and the second compensation.

20 Claims, 19 Drawing Sheets

(51) Int. Cl.
    *H02M 3/157*    (2006.01)
    *H03M 1/06*     (2006.01)
    *H03M 1/44*     (2006.01)
    *H03M 1/50*     (2006.01)

(56) References Cited

U.S. PATENT DOCUMENTS

| | | | |
|---|---|---|---|
| 9,235,222 | B2 | 1/2016 | Oh et al. |
| 9,843,324 | B1 | 12/2017 | Hafizi et al. |
| 10,678,283 | B2 * | 6/2020 | Sanasi .................... G11C 5/147 |
| 11,249,530 | B1 * | 2/2022 | Pal .......................... G05F 1/59 |
| 2005/0225306 | A1 | 10/2005 | Oddoart et al. |
| 2009/0039849 | A1 | 2/2009 | Chang |
| 2014/0266103 | A1 | 9/2014 | Wang et al. |
| 2017/0024000 | A1 * | 1/2017 | Chen ..................... G06F 1/3293 |
| 2020/0142436 | A1 | 5/2020 | Chang et al. |
| 2021/0103308 | A1 | 4/2021 | Liu et al. |
| 2022/0300021 | A1 | 9/2022 | Gwon et al. |

FOREIGN PATENT DOCUMENTS

| | | |
|---|---|---|
| KR | 1020120098025 A | 9/2012 |
| KR | 1020140096625 A | 8/2014 |
| KR | 101790943 B1 | 10/2017 |
| KR | 1020220130400 A | 9/2022 |

OTHER PUBLICATIONS

Kwanghyun Shin, et al. "A 65nm 0.6-1.2V Low-Dropout Regulator Using Voltage-Difference-to-Time Converter With Direct Output Feedback", IEEE Transactions on Circuits and Systems—II: Express Briefs, vol. 68, No. 1, Jan. 2021.

* cited by examiner

LOW-DROPOUT REGULATOR

CROSS-REFERENCE TO RELATED APPLICATION(S)

This application claims benefit of priority to Korean Patent Application No. 10-2021-0170242 filed on Dec. 1, 2021 in the Korean Intellectual Property Office, the disclosure of which is incorporated herein by reference in its entirety.

BACKGROUND

The present inventive concept relates to a regulator, and more particularly, to a low-dropout (LDO) regulator.

An integrated circuit (IC) included in a memory chip and a non-memory chip may be designed to operate in a specific range of a power supply voltage. However, in the environment in which an actual circuit operates, there may be various variables, such as supply of a voltage, higher than an initially set power supply voltage, introduction of noise due to an external factor, and the like. A voltage regulator may be disposed in the power supply device to control supply of a constant power supply voltage to the integrated circuit. There may be two types of voltage regulators such as a linear regulator and a switching regulator. While the linear regulator has relatively low energy efficiency, as compared to the switching regulator, it may be advantageous for output voltage and noise removal. Accordingly, the linear regulator may be mainly used in a circuit operating sensitively to the power supply voltage. Meanwhile, an LDO regulator, a typical linear regulator, may be mainly used when a difference between an input voltage and an output voltage is not great. Recently, as a magnitude of a power supply voltage supplied to a circuit is reduced due to development of process technology, it may be needed to perform a high-performance regulating operation even at a low power supply voltage.

SUMMARY

An aspect of the present inventive concept is to provide an LDO regulator having improved performance at a low power supply voltage, regardless of a frequency of a clock signal, using an LDO regulator including a time domain loop block and an analog loop block.

According to an aspect of the present inventive concept, an LDO regulator includes a voltage-to-time converter configured to convert a fluctuation in an output voltage sensed from an output node of the LDO regulator into a time domain signal having a pulse type, and output the time domain signal, based on a clock signal; a time-to-voltage converter configured to receive the time domain signal, convert the time domain signal into a first voltage control signal performing first compensation for the output voltage, and output the first voltage control signal; an analog amplifier configured to output a second voltage control signal continuously performing second compensation for the output voltage, regardless of the clock signal; and a first pass transistor connected between a power supply line and the output node, and configured to drive the output voltage based on the second voltage control signal. The LDO regulator is configured to reduce the fluctuation in the output voltage, based on the first compensation and the second compensation.

According to an aspect of the present inventive concept, an LDO regulator includes a time domain loop block configured to convert a fluctuation in an output voltage sensed from an output node of the LDO regulator into a time domain signal and repeatedly perform first compensation for the fluctuation in the output voltage, based on a clock signal; and an analog loop block configured to perform second compensation for the fluctuation in the output voltage, regardless of the clock signal. The time domain loop block and the analog loop block are connected in parallel or in series. The LDO regulator is configured to reduce the fluctuation in the output voltage, based on the first compensation and the second compensation.

According to an aspect of the present inventive concept, an LDO regulator includes a time domain loop block configured to perform first compensation for a fluctuation in an output voltage on an output node of the LDO regulator based on a clock signal and the output voltage, and an analog loop block configured to perform second compensation for the fluctuation in the output voltage based on the output voltage regardless of the clock signal. The LDO regulator is configured to perform the first compensation through a time domain loop and the second compensation through an analog loop. When a fluctuation in the output voltage occurs, the second compensation by the analog loop is performed earlier than the first compensation by the time domain loop.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
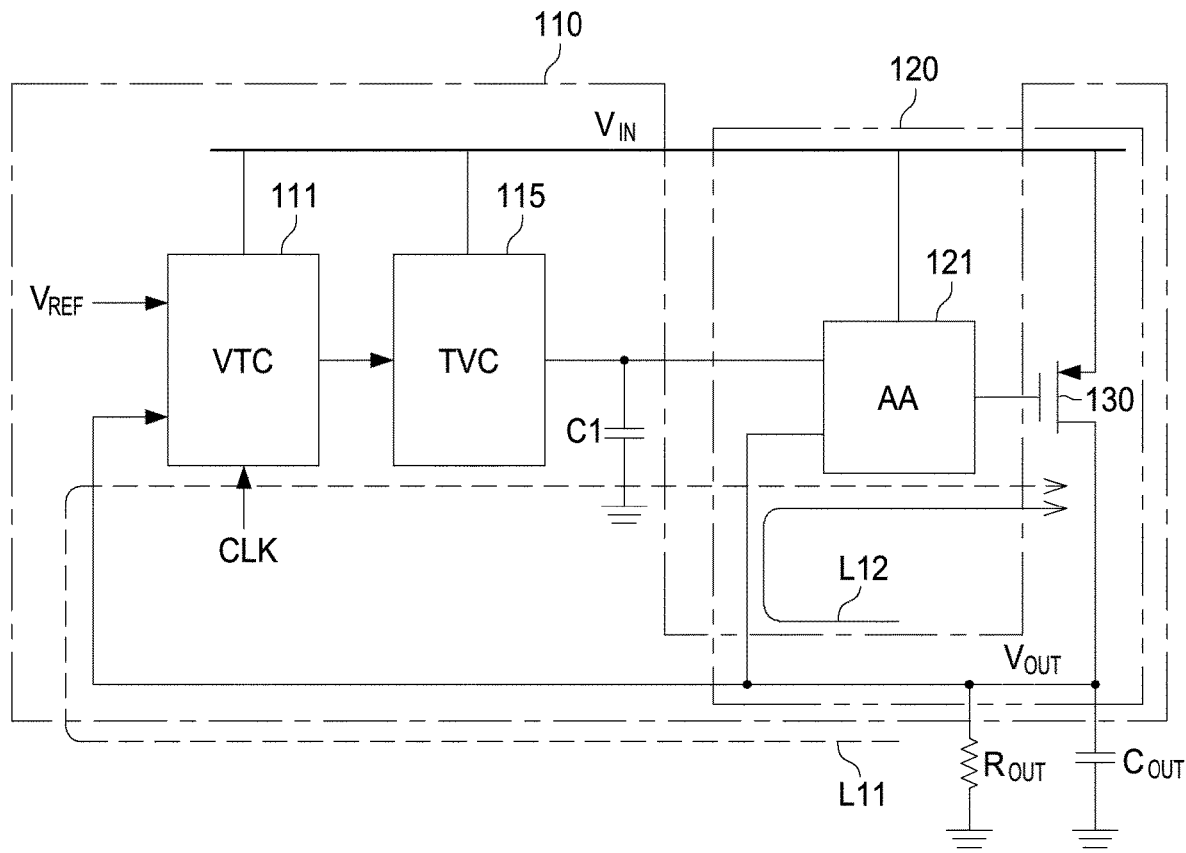
FIG. 1 is a circuit diagram simply illustrating an LDO regulator according to an embodiment of the present inventive concept.

FIG. 1 is a circuit diagram simply illustrating a low-dropout (LDO) regulator according to an embodiment of the present inventive concept.

Recently, as a magnitude of a power supply voltage supplied to a circuit is reduced due to development of process technology, it may be difficult to use a high-performance LDO regulator used with a power supply voltage of 1V or more. An LDO regulator 10 according to an embodiment of the present inventive concept may apply first compensation using a time domain driving method and second compensation using an analog driving method together, to perform a high-performance regulating operation even at a low power supply voltage.

Referring to FIG. 1, an LDO regulator 10 according to an embodiment of the present inventive concept may include a time domain loop block 110 and an analog loop block 120. An output voltage $V_{OUT}$ may be applied to the LDO regulator 10, and the LDO regulator 10 may adjust bias of the applied output voltage $V_{OUT}$. For example, the LDO regulator 10 may perform compensation for the output voltage $V_{OUT}$ using the time domain loop block 110 and the analog loop block 120, to maintain the output voltage $V_{OUT}$ at a constant level.

In the LDO regulator 10 according to an embodiment of the present inventive concept, the time domain loop block 110 may include a voltage-to-time converter (VTC) 111, a time-to-voltage converter (TVC) 115, and a pass transistor 130, arranged on a path of a first loop L11. For example, the first loop L11 may be defined as a time domain loop.

The time domain loop block 110 may perform first compensation for adjusting a fluctuation in the output voltage $V_{OUT}$ through the first loop L11. In this case, the first compensation in the time domain loop block 110 may be repeatedly performed a plurality of times, based on a clock signal applied to the time domain loop block 110.

The voltage-to-time converter 111 to which a power supply voltage $V_{IN}$ is applied may receive a reference voltage $V_{REF}$ and a feedbacked output voltage $V_{OUT}$, may compare both thereof, and may convert information of the fluctuation in the output voltage $V_{OUT}$ into a time domain signal having a pulse type. For example, the voltage-to-time converter 111 may feedback the output voltage $V_{OUT}$, when the output voltage $V_{OUT}$ increases or decreases, may compare the output voltage $V_{OUT}$ with the reference voltage $V_{REF}$, and may output a time domain signal including information on a degree to which the output voltage $V_{OUT}$ increases or decreases. In this case, the voltage-to-time converter 111 may convert the fluctuation in the output voltage $V_{OUT}$ into the time domain signal, based on a clock signal applied to the voltage-to-time converter 111, and may output the time domain signal. For example, the time domain signal may include a plurality of pulse signals.

The time-to-voltage converter 115 to which the power supply voltage $V_{IN}$ is applied may receive the time domain signal from the voltage-to-time converter 111, may compare to each of the plurality of pulse signals of the time domain signal, may convert the time domain signal into a first voltage control signal performing the first compensation for the output voltage $V_{OUT}$, and may output the first voltage control signal.

Referring to FIG. 1, the time domain loop block 110 and the analog loop block 120 included in the LDO regulator 10 according to an embodiment of the present inventive concept may share the pass transistor 130, and may be connected in series. Therefore, the first voltage control signal output from the time-to-voltage converter 115 may be input to the analog loop block 120. A capacitor C1 may be connected to an output node of the time-to-voltage converter 115.

In the LDO regulator 10 according to an embodiment of the present inventive concept, the analog loop block 120 may include an analog amplifier (AA) 121 and a pass transistor 130, arranged on a path of a second loop L12. For example, the second loop L12 may be defined as an analog loop.

The analog loop block 120 may perform second compensation for adjusting a fluctuation in the output voltage $V_{OUT}$ through the second loop L12. In this case, the second compensation in the analog loop block 120 may be performed at a point in time at which the fluctuation in the output voltage $V_{OUT}$ is detected, regardless of the clock signal.

The analog amplifier 121 to which the power supply voltage $V_{IN}$ is applied may receive the first voltage control signal output from the time-to-voltage converter 115, and a feedbacked output voltage $V_{OUT}$ (i.e., a feedback voltage $V_{FB}$). The analog amplifier 121 may compare the first voltage control signal and the output voltage $V_{OUT}$, to output a second voltage control signal continuously performing the second compensation for adjusting the fluctuation in the output voltage $V_{OUT}$.

When the output voltage $V_{OUT}$ decreases due to a rapid increase in load current, the analog amplifier 121 may feedback the output voltage $V_{OUT}$, may compare the output voltage $V_{OUT}$ with the first voltage control signal, and may input the output signal to a gate electrode of the pass transistor 130. When the pass transistor 130 is turned on by the second voltage control signal of the analog amplifier 121, the analog loop block 120 may apply the power supply voltage $V_{IN}$ to an output node, to adjust the output voltage $V_{OUT}$.

The pass transistor 130 may include a first electrode connected to the power supply voltage $V_{IN}$, and a second electrode connected to the output node, to output a power supply voltage $V_{IN}$ regulated by the output node. The output signal input to the gate electrode of the pass transistor 130 may include the first voltage control signal for performing the first compensation and the second voltage control signal for performing the second compensation.

The first voltage control signal and the second voltage control signal may control to output the output voltage $V_{OUT}$, based on the power supply voltage $V_{IN}$. For example, a magnitude of the output voltage $V_{OUT}$ may be determined to correspond to a magnitude of an output signal including the first voltage control signal and the second voltage control signal.

For example, when the output voltage $V_{OUT}$ decreases to be lower than the reference voltage $V_{REF}$, the first voltage control signal and the second voltage control signal may control the pass transistor 130 to increase a value of the output voltage $V_{OUT}$. When the output voltage $V_{OUT}$ increases to be higher than the reference voltage $V_{REF}$, the first voltage control signal and the second voltage control signal may control the pass transistor 130 to decrease a value of the output voltage $V_{OUT}$. In this case, the pass transistor 130 may be implemented as a MOSFET device.

For example, the pass transistor 130 may be driven by at least one of the first voltage control signal output from the time-to-voltage converter 115 or the second voltage control signal output from the analog amplifier 121.

For example, the pass transistor 130 may be driven by the first voltage control signal to perform the first compensation, or may be driven by the second voltage control signal to perform the second compensation. Also, the pass transistor 130 may be driven by the first voltage control signal and the second voltage control signal to perform the first compensation and the second compensation together.

A capacitor $C_{OUT}$ connected to the output node of the LDO regulator 10 may be used for preserving the output voltage $V_{OUT}$ during an operation of the LDO regulator 10. A resistor $R_{OUT}$ may be connected to the output node of the LDO regulator 10. Resistors corresponding to a feedback unit may be omitted from the LDO regulator 10 illustrated in FIG. 1, and a structure of the LDO regulator 10 is not limited to that illustrated.

The first voltage control signal may be a signal generated based on the clock signal. Therefore, the first voltage control signal may drive the pass transistor 130 according to an activation period of the clock signal. Therefore, the time domain loop block 110 may perform the first compensation for adjusting the fluctuation in the output voltage $V_{OUT}$, based on the first voltage control signal, whenever the clock signal is activated.

The second voltage control signal may be a signal generated based on the fluctuation in the output voltage $V_{OUT}$, regardless of the clock signal. Therefore, the second voltage control signal may drive the pass transistor 130, when the fluctuation in the output voltage $V_{OUT}$ is detected by the analog amplifier 121. Therefore, the analog loop block 120 may perform the second compensation for adjusting the fluctuation in the output voltage $V_{OUT}$, based on the second voltage control signal, regardless of the clock signal.

Referring to FIG. 1, since the pass transistor 130 of the LDO regulator 10 according to an embodiment of the present inventive concept may be shared by the time domain loop block 110 and the analog loop block 120, the pass transistor 130 may use an output signal of the analog amplifier 121, for example, the second voltage control signal, to perform the first compensation and the second compensation together.

In this case, the first compensation may be discontinuously performed, and the second compensation may be continuously performed. Therefore, a point in time at which the first compensation starts may be later than a point in time at which the second compensation starts. However, this is only illustrative and the present inventive concept is not limited thereto, and the point in time at which the first compensation starts may be the same as the point in time at which the second compensation starts.

Since the first compensation by the time domain loop block 110 is performed in synchronization with the clock signal, a speed of the first compensation may be limited according to a frequency of the clock signal. In addition, the second compensation by the analog loop block 120 may be performed separately from the clock signal, but the output voltage $V_{OUT}$ may not be sufficiently compensated because a gain may be limited at a low power supply voltage.

The LDO regulator 10 according to an embodiment of the present inventive concept may connect the time domain loop block 110 and the analog loop block 120 to the same output node, to stably maintain the output voltage $V_{OUT}$ at a constant level, based on the first compensation and the second compensation. Therefore, a high gain may be secured even at a low power supply voltage by the first compensation performed through the first loop L11, for example, the time domain loop, and the compensation may be performed quickly for the fluctuation in the output voltage $V_{OUT}$ by the second compensation performed through the second loop L12, for example, the analog loop.

Figure 2:
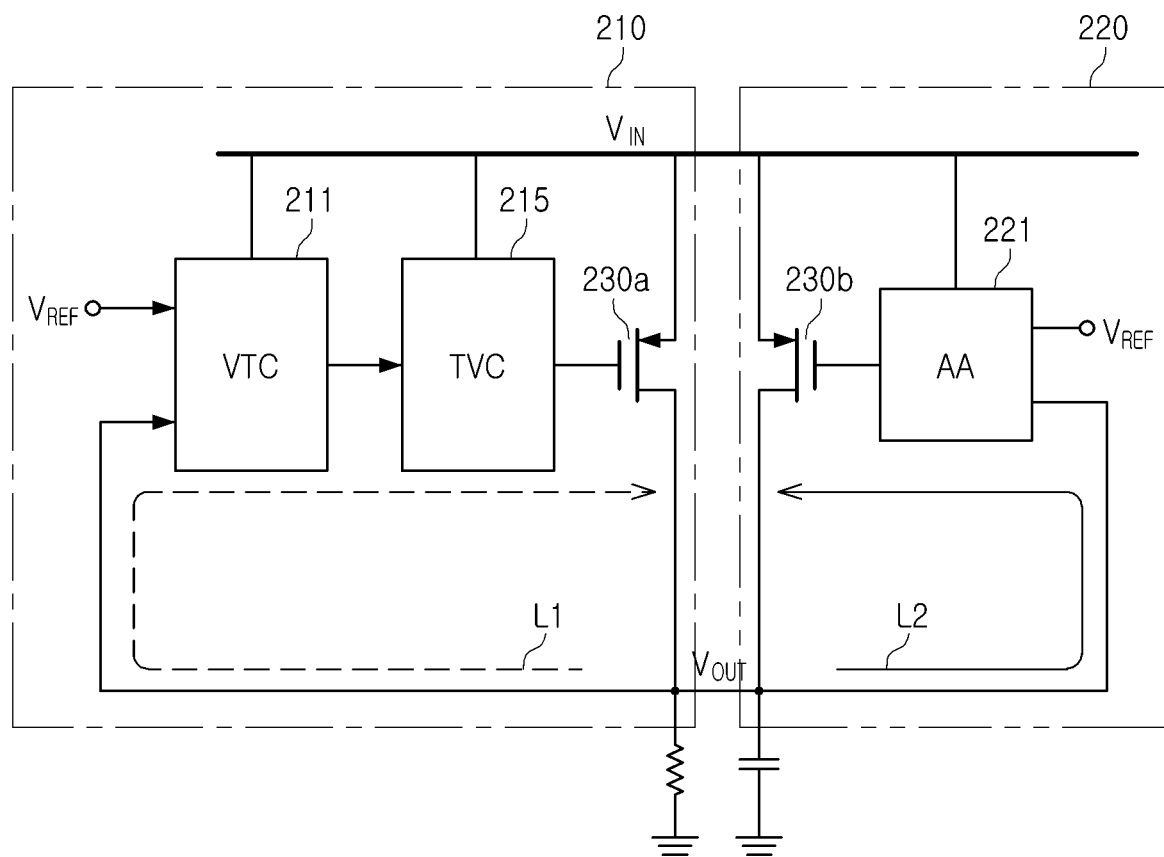
FIG. 2 is a circuit diagram simply illustrating an LDO regulator according to another embodiment of the present inventive concept.

FIG. 2 is a circuit diagram simply illustrating an LDO regulator according to another embodiment of the present inventive concept.

Referring to FIG. 2, an LDO regulator 20 according to an embodiment of the present inventive concept may correspond to the LDO regulator 10 illustrated in FIG. 1. As an example, the LDO regulator 20 may include a time domain loop block 210 and an analog loop block 220. An output voltage $V_{OUT}$ may be applied to the LDO regulator 20, and the LDO regulator 20 may adjust bias of the applied output voltage $V_{OUT}$. For example, the LDO regulator 20 may perform compensation for the output voltage $V_{OUT}$ using the time domain loop block 210 and the analog loop block 220, to maintain the output voltage $V_{OUT}$ at a constant level.

The time domain loop block 210 and the analog loop block 220 included in the LDO regulator 20 may include pass transistors 230*a* and 230*b*, respectively, and may be connected in parallel with each other. Therefore, signals input to the analog loop block 220 may be different from the signals input to the analog loop block 120 included in the LDO regulator 10 illustrated in FIG. 1.

In the LDO regulator 20 according to an embodiment of the present inventive concept, the time domain loop block 210 may include a voltage-to-time converter (VTC) 211, a time-to-voltage converter (TVC) 215, and a first pass transistor 230*a*, arranged on a path of a first loop L21. For example, the first loop L21 may be defined as a time domain loop.

The time domain loop block 210 may perform first compensation for adjusting a fluctuation in the output voltage $V_{OUT}$ through the first loop L21. In this case, the first compensation in the time domain loop block 210 may correspond to the first compensation in the time domain loop block 110 included in the LDO regulator 10 illustrated in FIG. 1.

For example, the voltage-to-time converter 211 may receive a reference voltage $V_{REF}$ and a feedbacked output voltage $V_{OUT}$, may compare them, and may convert information of the fluctuation in the output voltage $V_{OUT}$ into a time domain signal having a pulse type. The time-to-voltage converter 215 may receive the time domain signal from the voltage-to-time converter 211, may convert the time domain signal into a first voltage control signal performing the first compensation for the output voltage $V_{OUT}$, and may output the first voltage control signal.

In the LDO regulator 20 according to an embodiment of the present inventive concept, the analog loop block 220 may include an analog amplifier (AA) 221 and a second pass transistor 230*b*, arranged on a path of a second loop L22. For example, the second loop L22 may be defined as an analog loop.

The analog loop block 220 may perform second compensation for adjusting a fluctuation in the output voltage $V_{OUT}$ through the second loop L22. In this case, the second compensation in the analog loop block 220 may correspond to the second compensation in the analog loop block 120 included in the LDO regulator 10 illustrated in FIG. 1.

Since the analog loop block 220 may be connected in parallel with the time domain loop block 210, the analog amplifier 221 may receive the reference voltage $V_{REF}$ and the feedbacked output voltage $V_{OUT}$, like the voltage-to-time converter 211, and may output the second voltage control signal for performing the second compensation for the output voltage $V_{OUT}$.

The first voltage control signal may be applied to a gate electrode of the first pass transistor 230a included in the time domain loop block 210, to drive the first pass transistor 230a. The second voltage control signal may be applied to a gate electrode of the second pass transistor 230b included in the analog loop block 220, to drive the second pass transistor 230b.

The first pass transistor 230a and the second pass transistor 230b may include a first electrode connected to the power supply voltage $V_{IN}$ and a second electrode connected to an output node, to output a power supply voltage $V_{IN}$, regulated by the output node.

The first voltage control signal and the second voltage control signal may control to output the output voltage $V_{OUT}$, based on the power supply voltage $V_{IN}$. For example, a magnitude of the output voltage $V_{OUT}$ may be determined to correspond to a magnitude of each of the first voltage control signal and the second voltage control signal.

For example, when the output voltage $V_{OUT}$ decreases to be lower than the reference voltage $V_{REF}$, the first voltage control signal may control the first pass transistor 230a to increase a value of the output voltage $V_{OUT}$, and the second voltage control signal may control the second pass transistor 230b to increase a value of the output voltage $V_{OUT}$. When the output voltage $V_{OUT}$ increases to be higher than the reference voltage $V_{REF}$, the first voltage control signal may control the first pass transistor 230a to decrease a value of the output voltage $V_{OUT}$, and the second voltage control signal may control the second pass transistor 230b to decrease a value of the output voltage $V_{OUT}$.

For example, the LDO regulator 20 according to an embodiment of the present inventive concept may perform the first compensation using the first pass transistor 230a driven by the first voltage control signal, and perform the second compensation using the second pass transistor 230b driven by the second voltage control signal, to maintain the output voltage $V_{OUT}$ at a constant level.

Resistors corresponding to a feedback unit may be omitted from the LDO regulator 20 illustrated in FIG. 2, and a structure of the LDO regulator 20 is not limited to that illustrated.

The first voltage control signal may be a signal generated based on a clock signal, and the second voltage control signal may be a signal generated regardless of the clock signal. Therefore, the LDO regulator 20 according to an embodiment of the present inventive concept may connect the time domain loop block 210 and the analog loop block 220 to the same output node. Therefore, a high gain may be secured even at a low power supply voltage by the first compensation performed through the first loop L21, and the compensation may be performed quickly for the fluctuation in the output voltage $V_{OUT}$ by the second compensation performed through the second loop L22.

In example embodiments, the LDO regulator 10 or 20 may be disposed in a semiconductor device. As used herein, a semiconductor device may refer to various items such as a memory device or a logic device formed in or on a semiconductor substrate, a semiconductor chip, a memory chip, a memory die, a logic chip, a package, a package including one or more memory chips and optionally one or more logic chips, or combinations thereof. A semiconductor device such as a semiconductor chip, a memory chip, or a logic chip may be formed from a wafer. A semiconductor memory device may comprise a package which may include one or more chips stacked on a package substrate, or a package-on-package device including a plurality of packages.

Figure 3A:
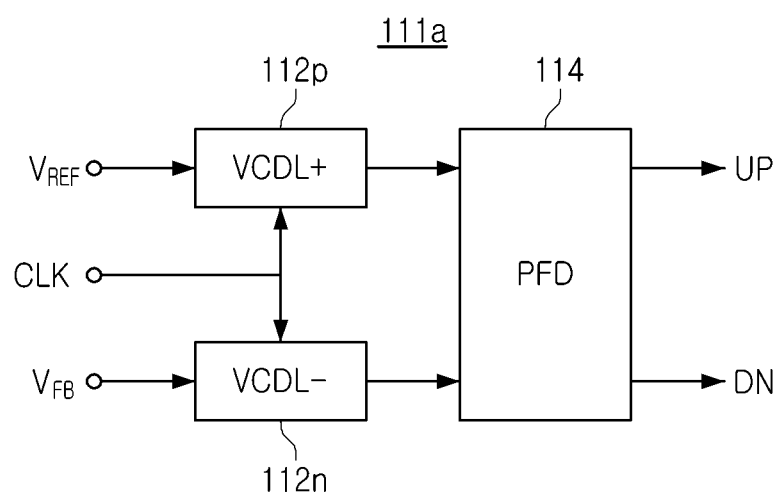
FIGS. 3A and 3B are circuit diagrams simply illustrating a voltage-to-time converter included in an LDO regulator according to embodiments of the present inventive concept.
Figure 3B:
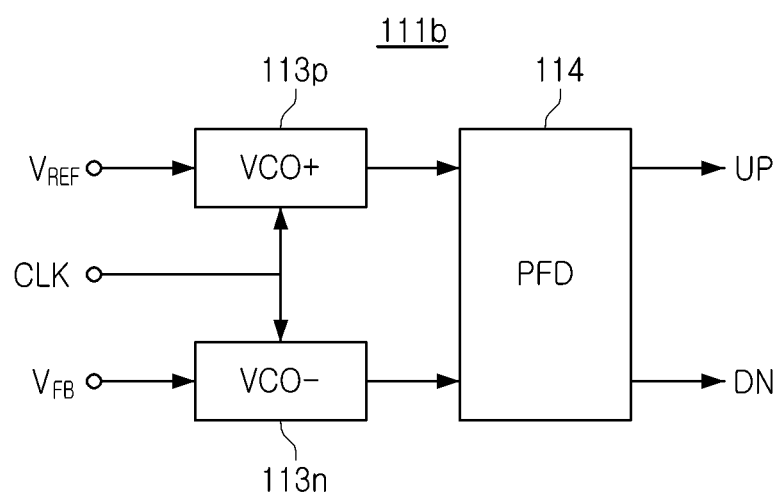

FIGS. 3A and 3B are circuit diagrams simply illustrating a voltage-to-time converter included in an LDO regulator according to embodiments of the present inventive concept.

Referring to FIGS. 3A and 3B, voltage-to-time converters 111a and 111b may be examples of the voltage-to-time converter 111 included in the LDO regulator 10 illustrated in FIG. 1. Also, the voltage-to-time converters 111a and 111b may be applied to the voltage-to-time converter 211 included in the LDO regulator 20 illustrated in FIG. 2.

Referring to FIG. 3A, the voltage-to-time converter 111a may include voltage controlled delay lines (VCDL) 112p and 112n, and a phase frequency detector (PFD) 114. In this case, the voltage controlled delay lines 112p and 112n may not form an additional pole in a system including a time domain loop.

For example, each of the voltage controlled delay lines 112p and 112n may delay an input signal (e.g., a clock signal CLK), based on a difference between a reference voltage $V_{REF}$ and a feedback voltage $V_{FB}$ (i.e., a feedbacked output voltage $V_{OUT}$), to be input, to generate an output signal having a phase difference. The output signal of each of the voltage controlled delay lines 112p and 112n may be synchronized with a clock signal CLK, and may be applied to the phase frequency detector 114. Herein, for convenience of description, the terms of "input voltage" and "input signal" and the terms of "output voltage" and "output signal" may be used interchangeably.

The voltage-to-time converter 111a included in the LDO regulator 10 according to an embodiment of the present inventive concept may use the phase frequency detector 114 to generate and output a pulse signal corresponding to the phase difference of the output signal. For example, the pulse signal may be a time domain signal.

When the feedback voltage $V_{FB}$ is lower than the reference voltage $V_{REF}$, the phase frequency detector 114 may output as much as a phase difference thereof to an up pulse UP. When the feedback voltage $V_{FB}$ is higher than the reference voltage $V_{REF}$, the phase frequency detector 114 may output as much as a phase difference thereof to a down pulse DN. When the feedback voltage $V_{FB}$ and the reference voltage $V_{REF}$ are the same as each other, the phase frequency detector 114 may output no signal. For example, the voltage-to-time converter 111a may perform a feedback operation until the reference voltage $V_{REF}$ and the feedback voltage $V_{FB}$ become the same.

Referring to FIG. 3B, a voltage-to-time converter 111b may include voltage controlled oscillators (VCO) 113p and 113n, and a phase frequency detector (PFD) 114. In this case, the voltage controlled oscillators 113p and 113n may additionally form a pole located at an origin of a system including a time domain loop.

For example, the voltage controlled oscillators 113p and 113n may generate output signals having a frequency difference from each other, based on a difference between a reference voltage $V_{REF}$ and a feedback voltage $V_{FB}$, to be input. The output signals of the voltage controlled oscillators 113p and 113n may be synchronized with a clock signal CLK, and may be applied to the phase frequency detector 114.

The voltage-to-time converter 111b included in the LDO regulator 10 according to an embodiment of the present inventive concept may use the phase frequency detector 114 to generate and output a pulse signal corresponding to the frequency difference of the output signals of the voltage controlled oscillators 113p and 113n. For example, the pulse signal may be a time domain signal.

When a frequency of the feedback voltage $V_{FB}$ is lower than a frequency of the reference voltage $V_{REF}$, the phase frequency detector 114 may output as much as a frequency difference thereof to an up pulse UP. When the frequency of the feedback voltage $V_{FB}$ is higher than the frequency of the reference voltage $V_{REF}$, the phase frequency detector 114 may output as much as a frequency difference thereof to a down pulse DN. When the frequency of the feedback voltage $V_{FB}$ is equal to the frequency of the reference voltage $V_{REF}$, the phase frequency detector 114 may output no signal. For example, the voltage-to-time converter 111b may perform a feedback operation until the frequency of the feedback voltage $V_{FB}$ and the frequency of the reference voltage $V_{REF}$ become the same.

Figure 4:
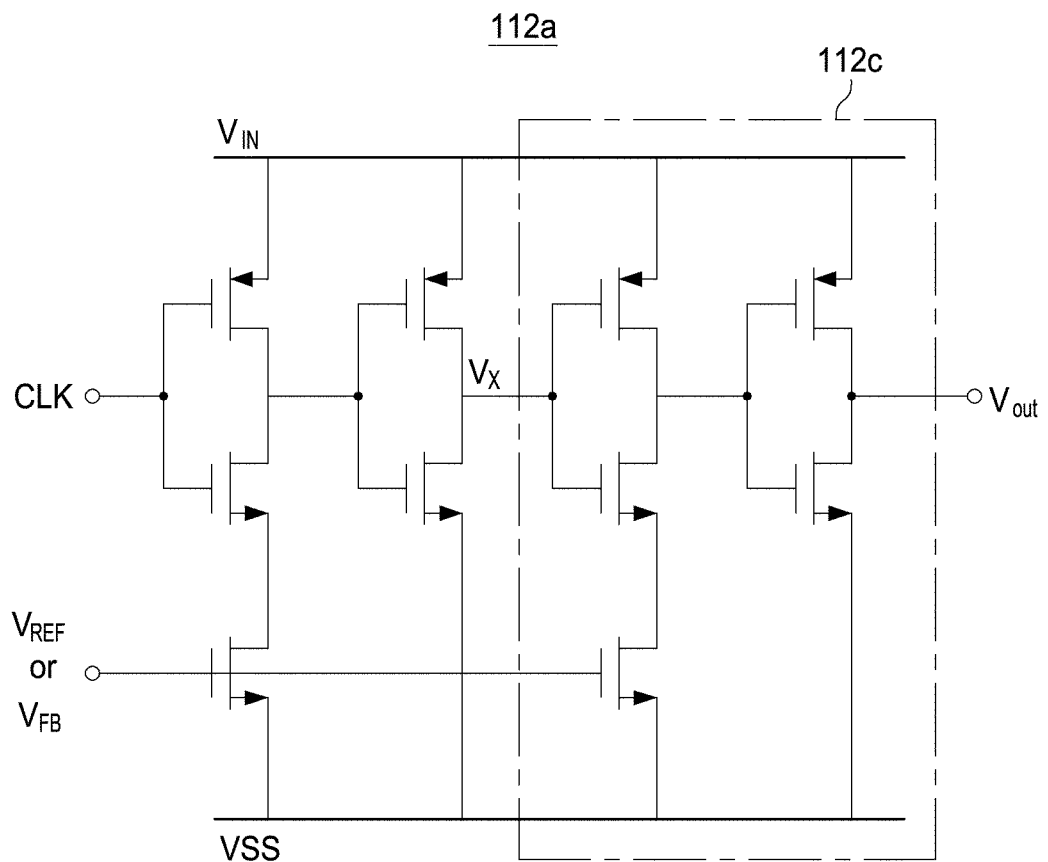
FIG. 4 is a circuit diagram simply illustrating a voltage controlled delay line included in an LDO regulator according to an embodiment of the present inventive concept.
Figure 5:
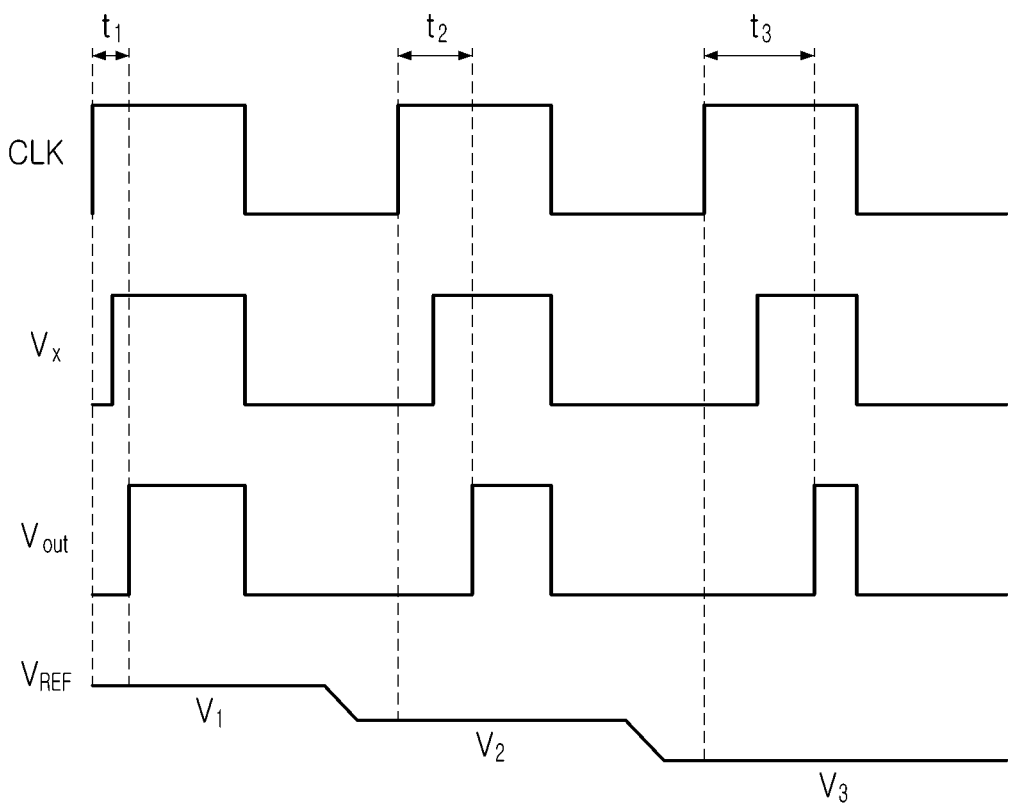
FIG. 5 is a waveform diagram illustrating an operation of a voltage-to-time converter included in the LDO regulator according to an embodiment of the present inventive concept.

FIG. 4 is a circuit diagram simply illustrating a voltage controlled delay line included in the LDO regulator 10 or 20 according to an embodiment of the present inventive concept. FIG. 5 is a waveform diagram illustrating an operation of a voltage-to-time converter included in the LDO regulator 10 or 20 according to an embodiment of the present inventive concept.

Referring to FIG. 4, a voltage controlled delay line 112a may be an example in which one of the VCDLs 112p and 112n illustrated in FIG. 3A is implemented as a circuit for explanation of its output waveform. The voltage controlled delay line 112a may be the voltage controlled delay line 112p or 112n. For example, the voltage controlled delay line 112a may include a circuit 112c. In some examples, the voltage controlled delay line 112a may include two or more circuits 112c each circuit connected in series.

For example, the voltage controlled delay line 112a may be driven by a first power supply voltage $V_{IN}$ and a second power supply voltage VSS. A reference voltage $V_{REF}$ or a feedback voltage $V_{FB}$ may be input to the voltage controlled delay line 112a as input signals, and an input voltage $V_X$ to be input to the circuit 112c and an output voltage $V_{out}$ of the circuit 112c may be synchronized with a clock signal CLK.

Referring to FIG. 5, a change in magnitude of a reference voltage $V_{REF}$ input to the voltage controlled delay line 112a may be proportional to a delayed phase of the output voltage $V_{out}$. For example, as the magnitude of the input reference voltage $V_{REF}$ is smaller, a delay time period of the output voltage $V_{out}$ may increase. Therefore, a width of the output voltage $V_{out}$ synchronized with a clock signal CLK may be reduced.

For example, a first delay time period $t_1$ of a first output voltage corresponding to a first input voltage $V_1$ may be less than a second delay time period $t_2$ of a second output voltage corresponding to a second input voltage $V_2$, lower than the first input voltage $V_1$. Likewise, the second delay time period $t_2$ of the second output voltage corresponding to the second input voltage $V_2$ may be less than a third delay time period $t_3$ of a third output voltage corresponding to a third input voltage $V_3$, lower than the second input voltage $V_2$.

FIG. 4 and FIG. 5 are diagrams illustrating a structure and an operation of the voltage controlled delay line 112a to which one input signal is applied. In the LDO regulator 10 according to an embodiment of the present inventive concept, the voltage-to-time converter 111a, illustrated in FIG. 3A, may convert a difference between a reference voltage $V_{REF}$ and a feedback voltage $V_{FB}$ into a time domain signal corresponding to information on a time axis having a pulse type, and may output the converted time domain signal.

The time domain signal may include a plurality of pulse signals corresponding to an activated state. The time domain signal may include information on a width, a rising edge, and a falling edge of each of the plurality of pulse signals. For example, the width of each of the plurality of pulse signals may include information about a time period during which the time domain signal is activated/deactivated, the rising edge and the falling edge of each of the plurality of pulse signals may include information about a transition time period of the time domain signal.

FIGS. 6A to 6D are circuit diagrams simply illustrating a time-to-voltage converter included in the LDO regulator 10 or 20 according to embodiments of the present inventive concept. FIG. 7 is a waveform diagram illustrating an operation of a time-to-voltage converter included in the LDO regulator according to an embodiment of the present inventive concept.

Referring to FIGS. 6A to 6D, time-to-voltage converters 115a, 115b, 115c, and 115d may be examples of the time-to-voltage converter 115 included in the LDO regulator 10 illustrated in FIG. 1. Also, the time-to-voltage converters 115a, 115b, 115c, 115d may be applied to the time-to-voltage converter 215 included in the LDO regulator 20 illustrated in FIG. 2.

For example, each of the time-to-voltage converters 115a, 115b, 115c, and 115d may include a charge pump. The charge pump may turn on/off a switch controlled by an up pulse UP and a down pulse DN, generated by a phase frequency detector. The charge pump may convert the up pulse UP and the down pulse DN, generated by the phase frequency detector, into a voltage signal. This is only illustrative and is not limited. For example, the charge pump may convert the up pulse UP and the down pulse DN, generated by the phase frequency detector, into a current signal, and may supply the current signal to a low-pass filter, and the current signal may be converted into a voltage signal by the low-pass filter.

Figure 6A:
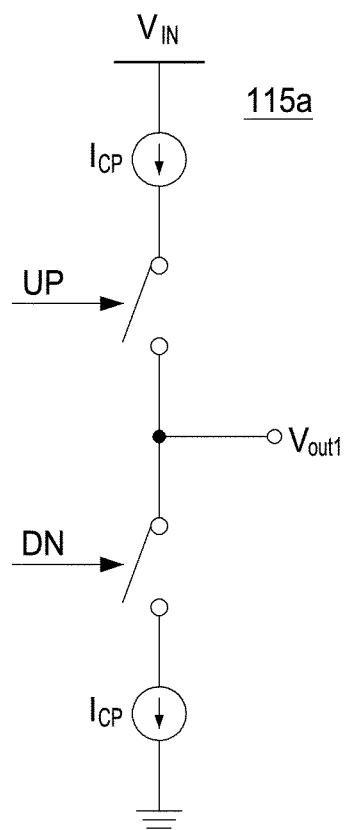
FIGS. 6A to 6D are circuit diagrams simply illustrating a time-to-voltage converter included in an LDO regulator according to embodiments of the present inventive concept.
Figure 7:
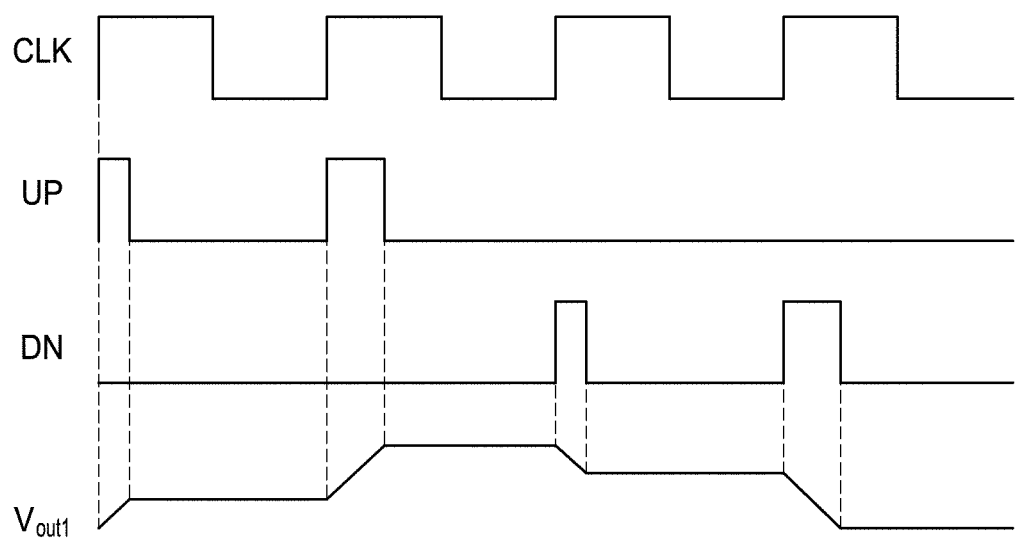
FIG. 7 is a waveform diagram illustrating an operation of a time-to-voltage converter included in an LDO regulator according to an embodiment of the present inventive concept.

Referring to FIG. 6A, a charge pump included in a time-to-voltage converter 115a may include current sources $I_{CP}$. An output voltage $V_{out1}$ of the time-to-voltage converter 115a may be determined by an electric charge supplied from the current sources $I_{CP}$ may be decided.

Figure 6B:
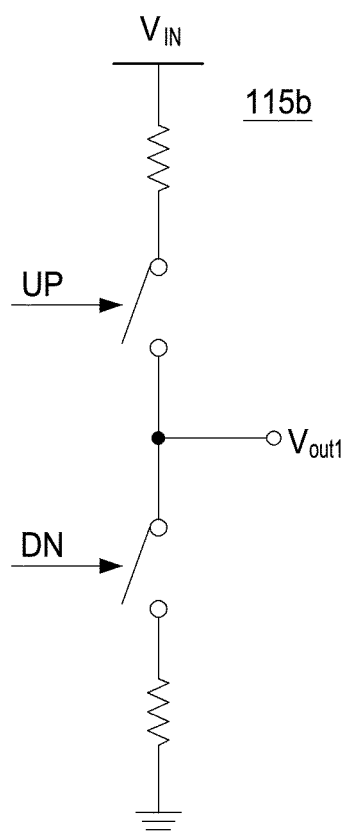

Referring to FIG. 6B, a charge pump included in a time-to-voltage converter 115b may include resistors serving as loads. An output voltage $V_{out1}$ of the time-to-voltage converter 115b may be determined by an electric charge supplied through the resistors.

Figure 6C:
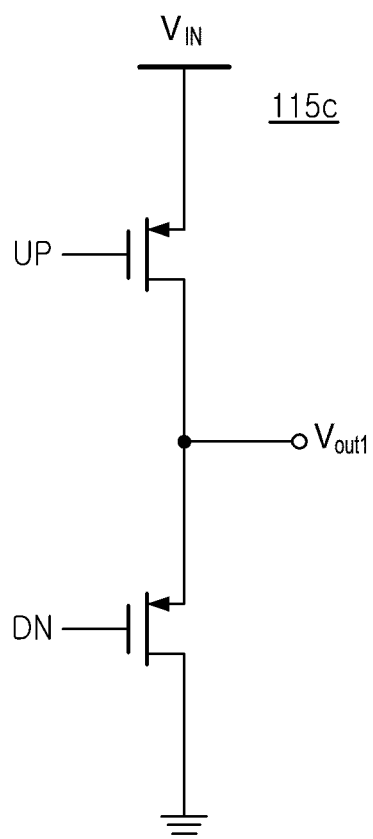

Referring to FIG. 6C, a charge pump included in a time-to-voltage converter 115c may include transistors serving as switches. For example, an up pulse UP and a down pulse DN, generated by a phase frequency detector, may be respectively applied to gate electrodes of the transistors, and an output voltage $V_{out1}$ of the time-to-voltage converter 115c may be determined by an electric charge supplied by the transistors, turned-on.

Figure 6D:
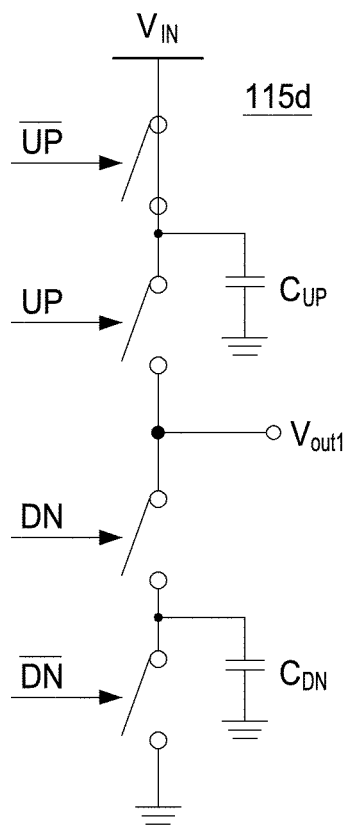

Referring to FIG. 6D, a charge pump included in a time-to-voltage converter 115d may include switches controlled by an up pulse UP and a down pulse DN, and switches controlled by an inversed up pulse $\overline{UP}$ and an inversed down pulse $\overline{DN}$. In addition, the time-to-voltage converter 115d may include a capacitor $C_{UP}$ connected between switches controlled by the up pulse UP and the inversed up pulse $\overline{UP}$ and a capacitor $C_{DN}$ connected between the switches controlled by the down pulse DN and the inversed down pulse $\overline{DN}$. For example, the switches controlled by the up pulse UP and the inversed up pulse $\overline{UP}$ may be connected in series, and the switches controlled by the down pulse DN and the inversed down pulse $\overline{DN}$ may be connected in series. An output voltage $V_{out1}$ of the time-to-voltage converter 115d may be determined by an electric charge supplied by switches turned-on.

The output voltage $V_{out1}$ of each of the time-to-voltage converters 115a to 115d may correspond to the first voltage control signal of the time-to-voltage converter 115 illustrated in FIG. 1 or the time-to-voltage converter 215 illustrated in FIG. 2.

Structures of the time-to-voltage converters 115a, 115b, 115c, and 115d illustrated in FIGS. 6A to 6D are only illustrative and are not limited. For example, the time-to-voltage converter 115 or 215 may be implemented as a circuit having various structures in which electric charges are supplied between an output node and a power supply voltage or between an output node and a ground voltage.

Referring to FIG. 7, the time-to-voltage converter 115 or 215 may control an output voltage $V_{out1}$, based on a time period during which an up pulse UP and a down pulse DN are activated. For example, the time-to-voltage converter 115 or 215 may increase the output voltage $V_{out1}$ during a time period during which the input up pulse UP is activated, and the time-to-voltage converter 115 may decrease the output voltage $V_{out1}$ during a time period during which the input down pulse DN is be activated.

Since an up pulse UP and a down pulse DN, output from the voltage-to-time converter 111a or 111b, are signals synchronized with the clock signal CLK, the output voltage $V_{out1}$ may be adjusted at a rising edge of the clock signal CLK.

Figure 8:
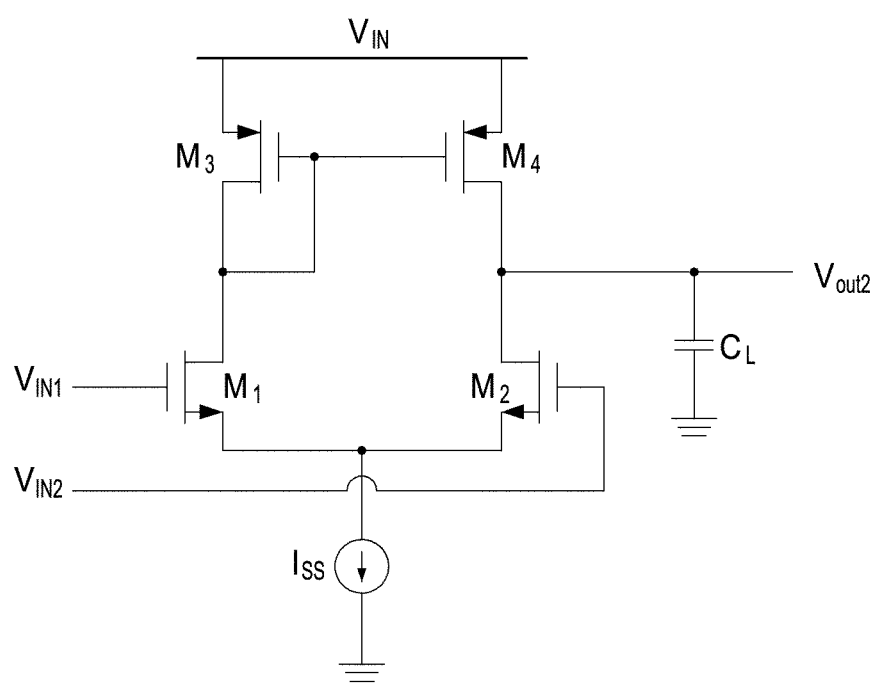
FIGS. 8 to 10 are circuit diagrams simply illustrating an analog amplifier included in an LDO regulator according to an embodiment of the present inventive concept.
Figure 9:
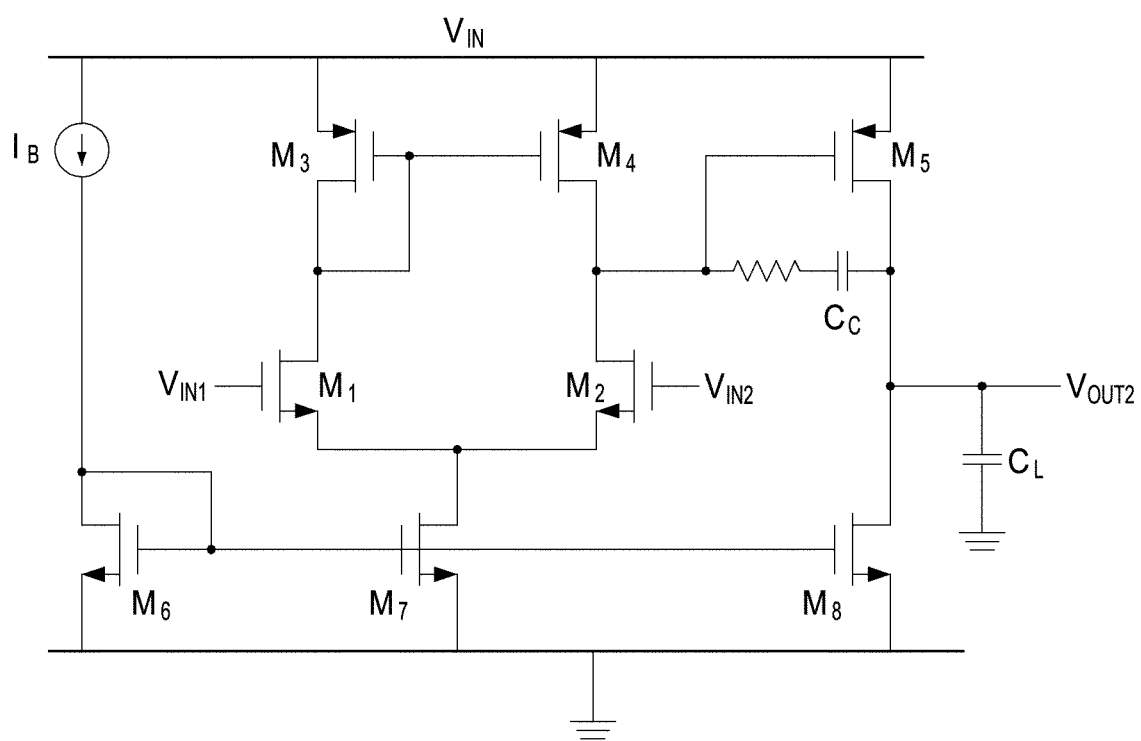
Figure 10:
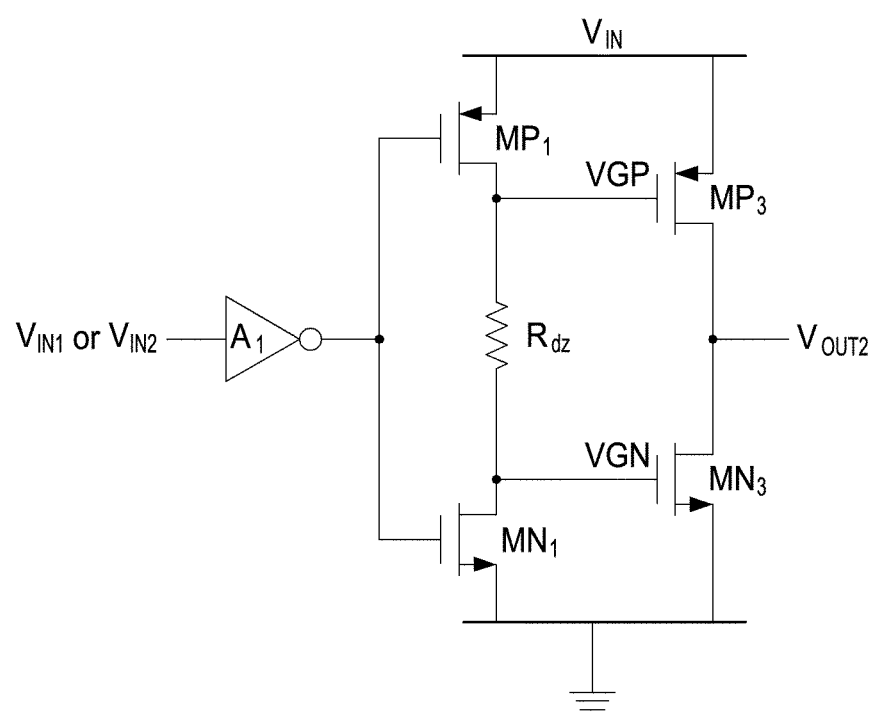

FIGS. 8 to 10 are circuit diagrams simply illustrating an analog amplifier included in the LDO regulator according to an embodiment of the present inventive concept.

Referring to FIGS. 8 and 9, analog amplifiers 121a and 121b may be examples of the analog amplifier 121 included in the LDO regulator 10 illustrated in FIG. 1. Also, the analog amplifiers 121a and 121b may be applied to the analog amplifier 221 included in the LDO regulator 20 illustrated in FIG. 2.

For example, the analog amplifiers 121a and 121b may be differential amplifiers including active elements. However, this is only illustrative and is not limited. Each of the analog amplifiers 121a and 121b may amplify a difference between two input voltages $V_{IN1}$ and $V_{IN2}$ and output an output signal $V_{out2}$. In this case, a portion of the active elements of the analog amplifiers 121a and 121b may be implemented as a current mirror to serve as a load while supplying a bias current.

In the LDO regulator 10 illustrated in FIG. 1, according to an embodiment of the present inventive concept, each of the analog amplifiers 121a and 121b may have the first voltage control signal output from the time-to-voltage converter 115 and the output voltage $V_{OUT}$ sensed from the output node, as two input signals. In the LDO regulator 20 illustrated in FIG. 2, according to an embodiment of the present inventive concept, each of the analog amplifiers 121a and 121b may have the reference voltage $V_{REF}$ and the output voltage $V_{OUT}$ sensed from the output node, as two input signals.

For example, the two input signals $V_{IN1}$ and $V_{IN2}$ of each of the analog amplifiers 121a and 121b may correspond to the first voltage control signal output from the time-to-voltage converter 115 and a feedbacked output voltage $V_{OUT}$, respectively, and the output signal $V_{out2}$ of each of the analog amplifiers 121a and 121b may correspond to the second voltage control signal output from the analog amplifier 121, illustrated in FIG. 1. Also, two input signals $V_{IN1}$ and $V_{IN2}$ of each of the analog amplifiers 121a and 121b may correspond to the reference voltage $V_{REF}$ and a feedbacked output voltage $V_{OUT}$, respectively, and the output signal $V_{out2}$ of each of the analog amplifiers 121a and 121b may correspond to the second voltage control signal output from the analog amplifier 221, illustrated in FIG. 2.

Referring to FIG. 8, the analog amplifier 121a may have a single-stage structure. For example, the analog amplifier 121a may include a first transistor $M_1$ and a second transistor $M_2$, to be received the first and second input signals $V_{IN1}$ and $V_{IN2}$, respectively and matched with each other, and may include a third transistor $M_3$ and a fourth transistor $M_4$, which are active loads. The analog amplifier 121a may be implemented to output an output signal $V_{out2}$ from two input signals $V_{IN1}$ and $V_{IN2}$. The analog amplifier 121a may include a bias current source $I_{SS}$ connected to the first transistor $M_1$ and the second transistor $M_2$. However, this is only illustrative and a configuration of the analog amplifier 121a having a single-stage structure may vary. As an example, the bias current source $I_{SS}$ may include a transistor or a resistor.

Referring to FIG. 9, the analog amplifier 121b may have a multi-stage structure. For example, the analog amplifier 121b may have a structure in which the analog amplifier 121a illustrated in FIG. 8 is provided as two analog amplifiers 121a connected in a cascade. The analog amplifier 121b may be implemented to output an output signal $V_{out2}$ from two input signals $V_{IN1}$ and $V_{IN2}$. Therefore, the analog amplifier 121b may further include fifth to eighth transistors $M_5$, $M_6$, $M_7$, and $M_8$, in addition to the first to fourth transistors $M_1$, $M_2$, $M_3$, and $M_4$.

The analog amplifier 121b having a multi-stage structure may use a single-stage amplifier circuit to which the input signals $V_{IN1}$ and $V_{IN2}$ are applied, to increase a gain of the analog amplifier 121b, and may use a two-stage amplifier circuit to which the output signal $V_{out2}$ is output, to cover a wide range of output voltages.

Referring to FIG. 10, the analog amplifier 121c may include a ring-amplifier including an inverter $A_1$. Although the analog amplifier 121c is illustrated as having one input signal $V_{IN1}$ or $V_{IN2}$ and one output signal $V_{out2}$, but this is only for convenience of description and the present inventive concept is not limited thereto. For example, the analog amplifier 121c may have a structure for amplifying and outputting a difference between two input signals.

The ring-amplifier including the inverter $A_1$ may be used to precisely control an output voltage at a low power supply voltage. The analog amplifier 121c may include transistors MP1 and MN1 to which an input signal is applied to gate electrodes of the transistors MP1 and MN1 through the inverter $A_1$, transistors $MP_3$ and $MN_3$ connected to an output node, and a resistor $R_{dz}$ disposed between the transistors MP1 and MN1. However, this is only illustrative and a structure of the analog amplifier 121c may vary.

Figure 11:
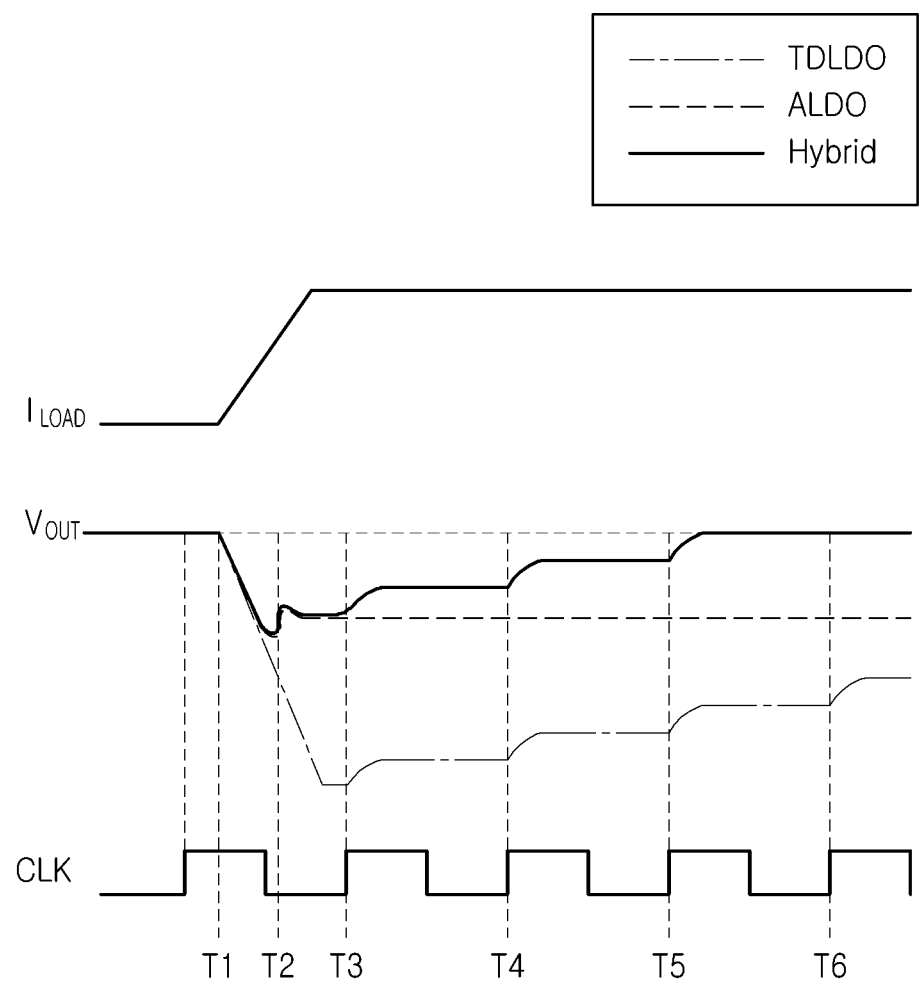
FIGS. 11 and 12 are views illustrating an effect of an LDO regulator according to an embodiment of the present inventive concept.
Figure 12:
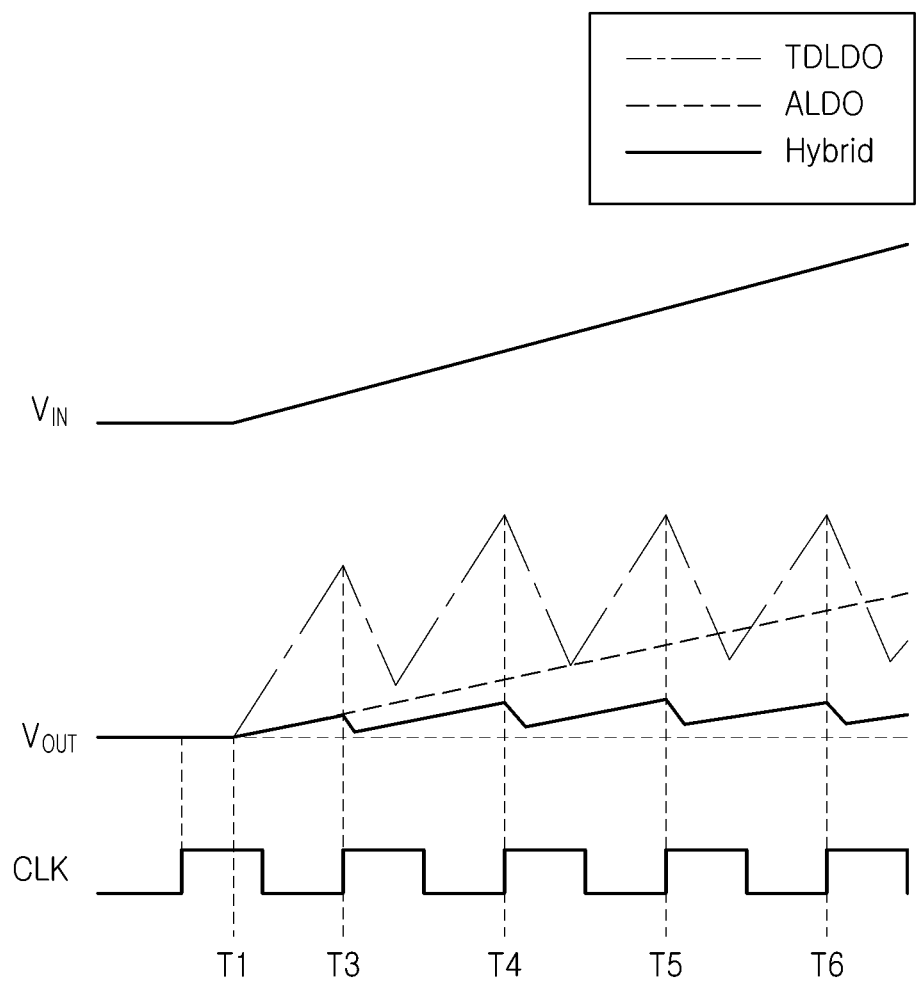

FIGS. 11 and 12 are views illustrating an effect of the LDO regulator according to an embodiment of the present inventive concept.

Referring to FIGS. 11 and 12, an LDO regulator Hybrid according to an embodiment of the present inventive concept may perform regulation faster and more stably, as compared to LDO regulators time domain LDO (TDLDO) and analog LDO (ALDO according to Comparative Example.

The LDO regulators according to Comparative Example may include a first LDO regulator TDLDO performing regulation only with a time domain loop, and a second LDO regulator ALDO performing regulation only with an analog loop. The LDO regulator Hybrid according to an embodiment of the present inventive concept may perform regulation using the time domain loop and the analog loop together. The LDO regulator Hybrid may be one of the LDO regulator 10 in FIG. 1 or the LDO regulator 20 in FIG. 2.

Referring to FIG. 11, the LDO regulator Hybrid according to an embodiment of the present inventive concept may perform regulation faster than a first LDO regulator TDLDO and a second LDO regulator ALDO.

The LDO regulators TDLDO, ALDO, and Hybrid may perform compensation for an output voltage $V_{OUT}$, sensed from an output node, to maintain the output voltage $V_{OUT}$ at a constant level, when a fluctuation in the output voltage $V_{OUT}$ occurs due to a fluctuation in load current $I_{LOAD}$. Referring to FIG. 1 together, the first LDO regulator TDLDO may perform first compensation through the first loop L11, the second LDO regulator ALDO may perform second compensation through the second loop L12, and an LDO regulator Hybrid according to an embodiment of the present inventive concept may perform the first compensation through the first loop L11 and the second compensation through the second loop L12 together.

First compensation in the first LDO regulator TDLDO may be performed based on a synchronized clock signal CLK. For example, the output voltage $V_{OUT}$ may decrease at a first point in time T1. The first LDO regulator TDLDO may sense a fluctuation in the output voltage $V_{OUT}$ at a third point in time T3 corresponding to a rising edge of the clock signal CLK, after the first point in time T1, to perform the first compensation.

The first compensation of the output voltage $V_{OUT}$ through the time domain loop may be performed a plurality of times, based on the first voltage control signal, whenever the clock signal CLK is activated by a feedback operation. For example, the first compensation in the first LDO regulator TDLDO may be performed at the third point in time T3, a fourth point in time T4, a fifth point in time T5, and a sixth point in time T6, corresponding to the rising edge of the clock signal CLK, and may be performed until the output voltage $V_{OUT}$ reaches an initial value corresponding to the reference voltage.

Second compensation in the second LDO regulator ALDO may be performed, regardless of a clock signal CLK. Therefore, the second compensation may be quickly performed even for a fluctuation in an output voltage $V_{OUT}$ generated when the clock signal CLK is deactivated. In particular, when a frequency of the clock signal CLK is low, compensation of the output voltage $V_{OUT}$ by the first compensation may take a considerable amount of time, but compensation of the output voltage $V_{OUT}$ by the second compensation may be performed immediately when the fluctuation in the output voltage $V_{OUT}$ is detected by the analog amplifier. Therefore, the second compensation may minimize overshoot and/or undershoot of the output voltage $V_{OUT}$.

The second compensation of the output voltage $V_{OUT}$ through the analog loop may be performed at a point in time at which the fluctuation in the output voltage $V_{OUT}$ is detected by the analog amplifier. For example, in the second compensation in the second LDO regulator ALDO, after the first point in time T1 at which the output voltage $V_{OUT}$ is reduced, the second point in time T2 at which the fluctuation in the output voltage $V_{OUT}$ is detected by the analog amplifier.

Due to an operating voltage basically required for an operation of the analog amplifier, a gain of the analog amplifier may be limited at a low power supply voltage. Therefore, even when the second compensation is performed, the output voltage $V_{OUT}$ may not reach an initial value corresponding to the reference voltage.

The LDO regulator Hybrid according to an embodiment of the present inventive concept may maintain the output voltage $V_{OUT}$ at a constant level through the first compensation performed through the time domain loop and the second compensation performed through the analog loop, with respect to the output voltage $V_{OUT}$. For example, after the fluctuation in the output voltage $V_{OUT}$ is generated at the first point in time T1, the LDO regulator Hybrid may perform the second compensation at the second point in time T2, and may perform the first compensation at the third point in time T3, as the signal CLK is activated.

The third point in time T3 at which the first compensation is performed may be later than the second point in time T2 at which the second compensation is performed. However, this is only illustrative and the present inventive concept is not limited thereto, and when the clock signal CLK is activated between the first point in time T1 and the second point in time T2, the third point in time T3 may be earlier than the second point in time T2.

The LDO regulator Hybrid according to an embodiment of the present inventive concept may apply the second compensation quickly performed for the fluctuation in the output voltage $V_{OUT}$, and the first compensation repeatedly performed until the output voltage $V_{OUT}$ reaches the reference voltage, together.

Therefore, the LDO regulator Hybrid may quickly perform regulation. For example, the first compensation for the output voltage $V_{OUT}$ in the first LDO regulator TDLDO may be continuously performed, even after the sixth point in time T6, until the output voltage $V_{OUT}$ reaches the reference voltage, but compensation for the output voltage $V_{OUT}$ in the LDO regulator Hybrid may be finally performed at the fifth point in time T5. Therefore, a power consumption of the LDO regulator Hybrid may be lower than a power consumption of the first LDO regulator TDLDO or the second LDO regulator ALDO.

Referring to FIG. 12, the LDO regulator Hybrid according to an embodiment of the present inventive concept may perform regulation more stably than a first LDO regulator TDLDO and a second LDO regulator ALDO.

A fluctuation in an output voltage $V_{OUT}$ may include a fluctuation due to a ripple voltage. First compensation performed through a time domain loop and second compensation performed through an analog loop may reduce the ripple voltage included in the output voltage $V_{OUT}$.

As described above, first compensation in the first LDO regulator TDLDO may be performed based on a synchronized clock signal CLK. For example, the output voltage $V_{OUT}$ may increase at a first point in time T1 by the ripple voltage. The first LDO regulator TDLDO may sense a fluctuation in the output voltage $V_{OUT}$ at a third point in time T3 corresponding to a rising edge of the clock signal CLK, after the first point in time T1, to reduce the ripple voltage.

The first compensation of the output voltage $V_{OUT}$ through the time domain loop may be performed a plurality of times, based on the first voltage control signal, whenever the clock signal CLK is activated by a feedback operation. For example, the reduction of the ripple voltage by the first compensation in the first LDO regulator TDLDO may be performed at the third point in time T3, a fourth point in time T4, a fifth point in time T5, and a sixth point in time T6, corresponding to the rising edge of the clock signal CLK.

Second compensation in the second LDO regulator ALDO may be performed, regardless of the clock signal CLK. Therefore, the second compensation may be performed quickly even for a fluctuation in an output voltage $V_{OUT}$ generated when the clock signal CLK is deactivated. Therefore, an increase in the output voltage $V_{OUT}$ due to the ripple voltage in the second LDO regulator ALDO may be relatively small. However, when the second LDO regulator ALDO operates in a low voltage, the output voltage $V_{OUT}$ of the second LDO regulator ALDO may be increased based on increasing of the power supply voltage $V_{IN}$.

The LDO regulator Hybrid according to an embodiment of the present inventive concept may repeatedly reduce a ripple voltage having a low increment, generated by first compensation performed through a time domain loop and second compensation performed through an analog loop, with respect to an output voltage $V_{OUT}$. Therefore, the LDO regulator Hybrid may perform regulation more stably than the first LDO regulator TDLDO and the second LDO regulator ALDO.

Figure 13:
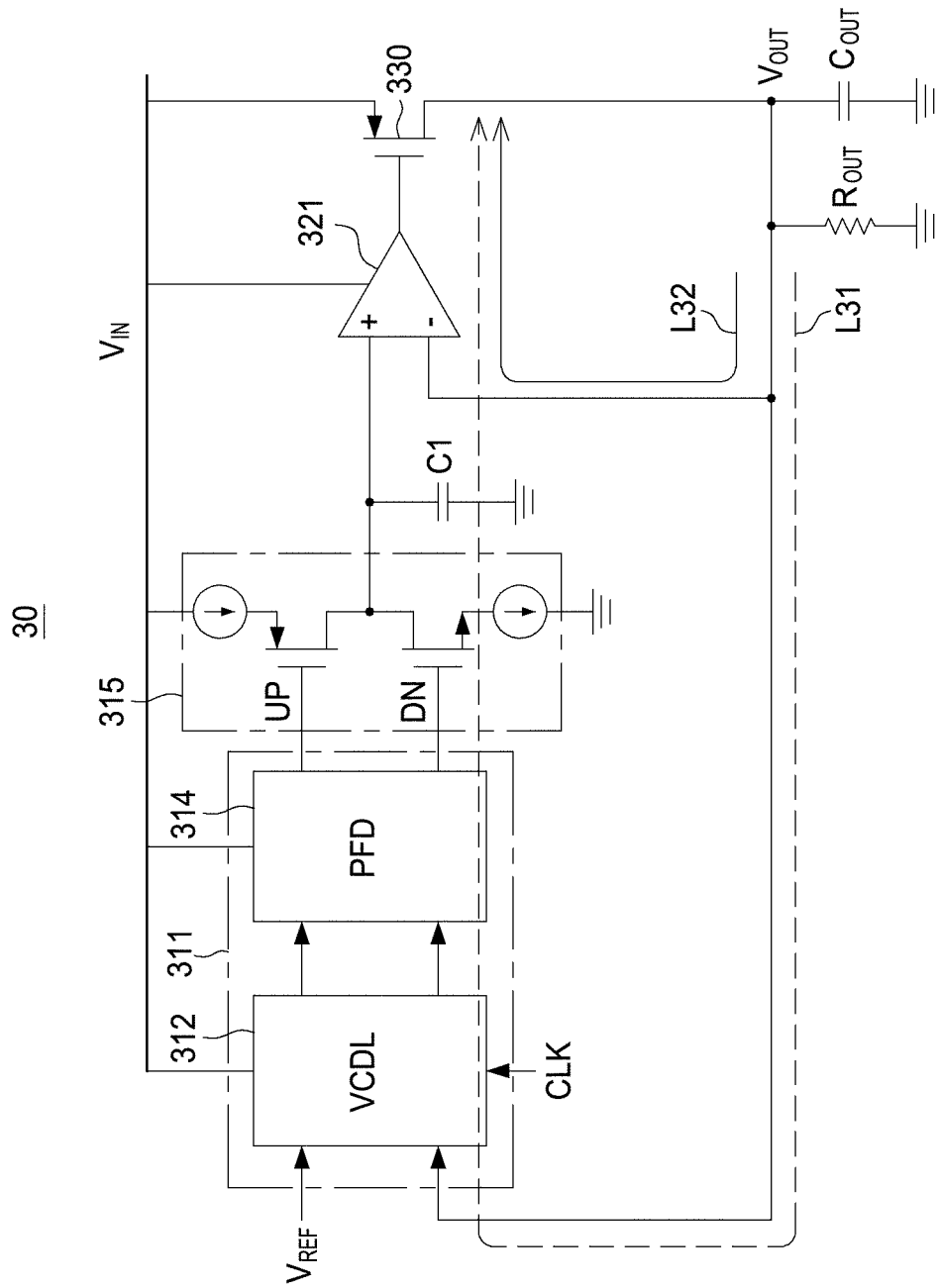
FIG. 13 is a circuit diagram illustrating an LDO regulator according to an embodiment of the present inventive concept.

FIG. 13 is a circuit diagram illustrating an LDO regulator according to an embodiment of the present inventive concept.

Referring to FIG. 13, an LDO regulator 30 according to an embodiment of the present inventive concept may be an example of the LDO regulator 10 illustrated in FIG. 1. For example, the LDO regulator 30 may include a time domain loop block and an analog loop block, sharing a pass transistor 330 and connected in series.

A voltage-to-time converter 311, a time-to-voltage converter 315, and the pass transistor 330 may be disposed on a first loop L31 for performing first compensation, and an analog amplifier 321 and the pass transistor 330 may be disposed on a second loop L32 for performing second compensation.

As an example, the voltage-to-time converter 311 may include a voltage controlled delay line 312 and a phase frequency detector 314. The voltage control delay line 312 may be controlled by a clock signal CLK, may receive a reference voltage $V_{REF}$ and an output voltage $V_{OUT}$ sensed from an output node, and may output a time domain signal. The phase frequency detector 314 may output an up pulse UP and/or a down pulse DN, based on the time domain signal.

The time-to-voltage converter 315 may include a charge pump including switching transistors and current sources. For example, the charge pump may output a first voltage control signal for performing the first compensation, based on the up pulse UP and/or the down pulse DN.

The first voltage control signal may be input to the analog amplifier 321 disposed on the second loop L32, together with the output voltage $V_{OUT}$ sensed from the output node. The analog amplifier 321 may amplify a difference between the first voltage control signal and the output voltage $V_{OUT}$, to output an output signal for driving the pass transistor 330. As an example, the output signal may include the first voltage control signal and a second voltage control signal for performing the second compensation.

Figure 14:
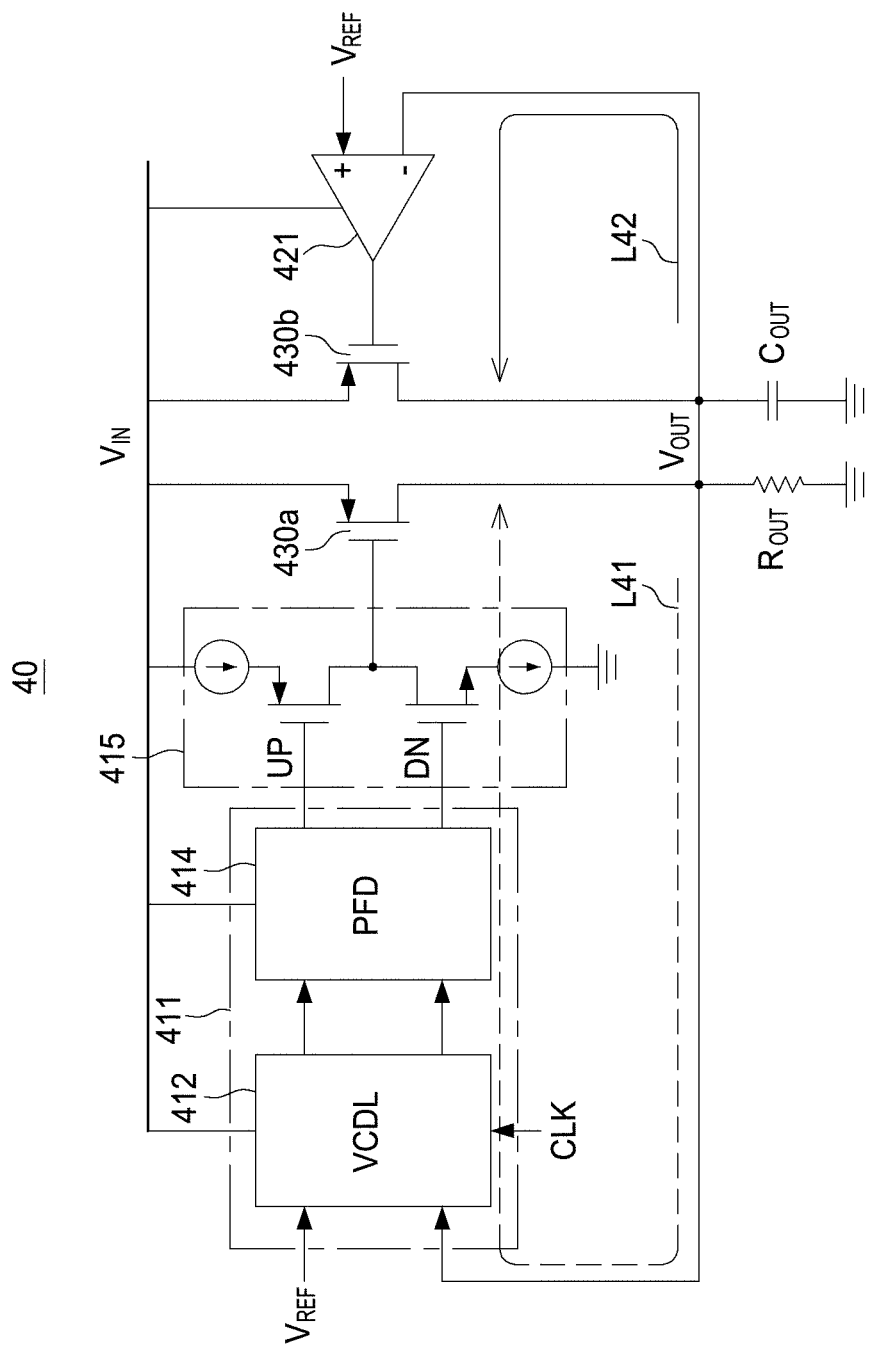
FIG. 14 is a circuit diagram illustrating an LDO regulator according to another embodiment of the present inventive concept.

FIG. 14 is a circuit diagram illustrating an LDO regulator according to another embodiment of the present inventive concept.

Referring to FIG. 14, an LDO regulator 40 according to an embodiment of the present inventive concept may be an example of the LDO regulator 20 illustrated in FIG. 2. For example, the LDO regulator 40 may include a time domain loop block and an analog loop block, connected in parallel.

A voltage-to-time converter 411, a time-to-voltage converter 415, and a first pass transistor 430a may be disposed on a first loop L41 for performing first compensation, and an analog amplifier 421 and a second pass transistor 430b may be disposed on a second loop L42 for performing second compensation.

The voltage-to-time converter 411 and the time-to-voltage converter 415 may correspond to the voltage-to-time converter 311 and the time-to-voltage converter 315 illustrated in FIG. 13, respectively. For example, the voltage-to-time converter 411 may include a voltage controlled delay line 412 and a phase frequency detector 414, and the time-to-voltage converter 415 may include a charge pump including switching transistors and current sources.

The charge pump may output a first voltage control signal for performing the first compensation, based on an up pulse UP and/or a down pulse DN, and apply the first voltage control signal to a gate electrode of the first pass transistor 430a.

The first loop L41 and the second loop L42 may be connected to only an output node and a power supply node, and may be separated from each other with respect to others than the output node and the power supply node. For example, the analog amplifier 421 disposed on the second loop L42 may receive a reference voltage $V_{REF}$ and an output voltage $V_{OUT}$, and may output a second voltage control signal for driving the second pass transistor 430b.

Figure 15:
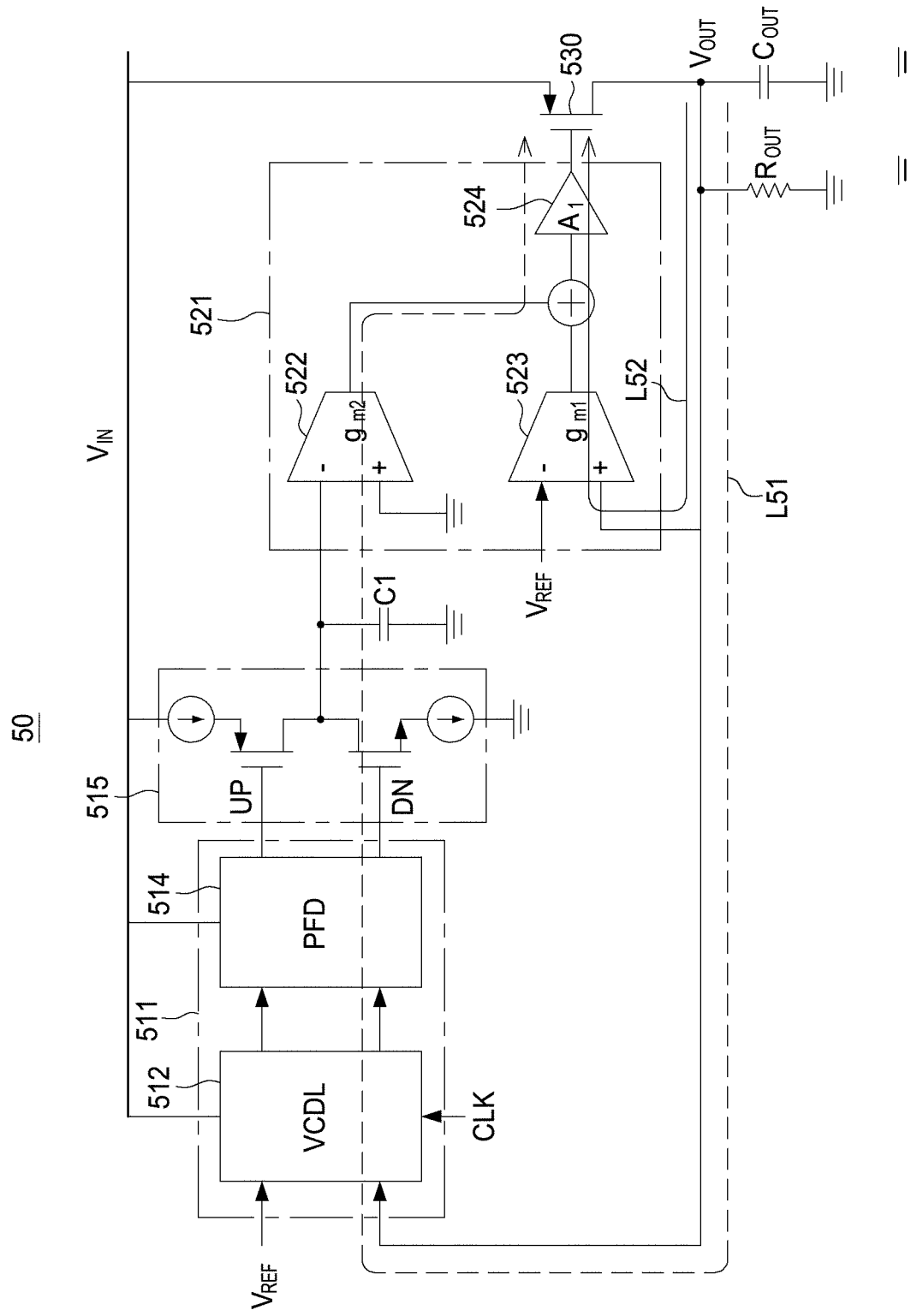
FIG. 15 is a circuit diagram illustrating an LDO regulator according to another embodiment of the present inventive concept.

FIG. 15 is a circuit diagram illustrating an LDO regulator according to another embodiment of the present inventive concept.

Referring to FIG. 15, an LDO regulator 50 according to an embodiment of the present inventive concept may include an analog amplifier 521 utilizing a first voltage control signal and a reference voltage $V_{REF}$ to output an output signal for driving a pass transistor 530.

Some of devices disposed on a time domain loop in the LDO regulator 50 may correspond to the configurations of the LDO regulator 30 illustrated in FIG. 13. As an example, the LDO regulator 50 may include a voltage-to-time converter 511 and a time-to-voltage converter 515, the voltage-to-time converter 511 may include a voltage controlled delay line 512 and a phase frequency detector 514, and the time-to-voltage converter 515 may include a charge pump including switching transistors and current sources.

The analog amplifier 521 may add up voltage control signals for compensating an output voltage $V_{OUT}$ in the form of a current signal. Thereafter, the added up voltage control signals may be converted back to form a voltage signal, and may be applied to a gate electrode of the pass transistor 530.

For example, the analog amplifier 521 may include a first trans-conductance amplifier 522 receiving a first voltage control signal output from the time-to-voltage converter 515 and outputting a first current signal. In addition, the analog amplifier 521 may include a second trans-conductance amplifier 523 receiving a reference voltage $V_{REF}$ and an output voltage $V_{OUT}$ sensed from an output node, and outputting a second current signal corresponding to a second voltage control signal according to a fluctuation in the output voltage $V_{OUT}$.

Therefore, the first trans-conductance amplifier 522 may be disposed on a first loop L51, e.g., a time domain loop, and the second trans-conductance amplifier 523 may be disposed on a second loop L52, e.g., an analog loop.

The analog amplifier 521 may further include a trans-resistance amplifier 524 receiving an added-up signal of the first current signal and the second current signal and converting the added-up signal into a voltage control signal for compensating the output voltage $V_{OUT}$. For example, the voltage control signal may be a signal in the form of a voltage.

The voltage control signal output from the trans-resistance amplifier 524 may drive the pass transistor 530 to control first compensation and second compensation of the LDO regulator 50. A structure of the LDO regulator 50 illustrated in FIG. 15 is only illustrative and is not limited.

The LDO regulator according to an embodiment of the present inventive concept may use a voltage-to-time converter and a time-to-voltage converter included in a time domain loop block, to perform compensation for controlling an output voltage to have a gain of a predetermined level or higher at a low power supply voltage.

The LDO regulator according to an embodiment of the present inventive concept may use an analog amplifier included in an analog loop block, to improve a regulating response speed and improve noise characteristics included in an output voltage.

Various advantages and effects of the present inventive concept are not limited to the above, and will be more easily understood in the process of describing specific embodiments of the present inventive concept.

While example embodiments have been illustrated and described above, it will be apparent to those skilled in the art that modifications and fluctuations could be made without departing from the scope of the present inventive concept as defined by the appended claims.

What is claimed is:

1. A low-dropout (LDO) regulator comprising:
a voltage-to-time converter configured to convert a fluctuation in an output voltage sensed from an output node of the LDO regulator into a time domain signal having a pulse type, and output the time domain signal, based on a clock signal;
a time-to-voltage converter configured to receive the time domain signal, convert the time domain signal into a first voltage control signal performing first compensation for the output voltage, and output the first voltage control signal;
an analog amplifier configured to output a second voltage control signal continuously performing second compensation for the output voltage, regardless of the clock signal; and
a first pass transistor connected between a power supply line and the output node, and configured to drive the output voltage based on the second voltage control signal,
wherein the LDO regulator is configured to reduce the fluctuation in the output voltage, based on the first compensation and the second compensation.

2. The LDO regulator of claim 1, wherein the voltage-to-time converter comprises:
a voltage controlled delay line (VCDL) configured to output first and second delayed clock signals based on a reference voltage and the output voltage, respectively; and
a phase frequency detector (PFD) configured to output the time domain signal based on the first and second delayed clock signals.

3. The LDO regulator of claim 1, wherein the time-to-voltage converter comprises:
a charge pump configured to output the first voltage control signal based on the time domain signal.

4. The LDO regulator of claim 1, wherein the time domain signal comprises a plurality of pulse signals corresponding to an activated state, and
wherein each of the plurality of pulse signals has information on a width, a rising edge, and a falling edge.

5. The LDO regulator of claim 1, wherein the LDO regulator is configured to perform the first compensation based on the first voltage control signal, whenever the clock signal is activated.

6. The LDO regulator of claim 1, wherein the LDO regulator is configured to perform the second compensation based on the second voltage control signal, when the fluctuation in the output voltage is detected by the analog amplifier.

7. The LDO regulator of claim 1, wherein the LDO regulator is configured to perform the first compensation later than the second compensation.

8. The LDO regulator of claim 1, wherein the analog amplifier is a differential amplifier including an active element.

9. The LDO regulator of claim 8, wherein the analog amplifier comprises a plurality of amplifier circuits connected in a cascade.

10. The LDO regulator of claim 1, wherein the voltage-to-time converter comprises:
a voltage controlled oscillator (VCO) configured to output first and second delayed clock signals based on a reference voltage and the output voltage, respectively; and
a phase frequency detector (PFD) configured to output the time domain signal based on the first and second delayed clock signals.

11. The LDO regulator of claim 1, wherein the analog amplifier is configured to receive the output voltage sensed from the output node and the first voltage control signal.

12. The LDO regulator of claim 1, further comprising:
a second pass transistor connected between the power supply line and the output node, and configured to drive the output voltage in response to the first voltage control signal,
wherein the analog amplifier is configured to receive the output voltage sensed from the output node and a reference voltage.

13. The LDO regulator of claim 1, wherein the voltage-to-time converter is configured to receive the output voltage sensed from the output node and a reference voltage for detecting the fluctuation in the output voltage.

14. The LDO regulator of claim 1, wherein the analog amplifier is configured to:
add up the first voltage control signal and the second voltage control signal in a form of a current signal, and
perform the first compensation and the second compensation for the output voltage.

15. The LDO regulator of claim 14, wherein the analog amplifier comprises:
a first trans-conductance amplifier configured to receive the first voltage control signal and output a first current signal;
a second trans-conductance amplifier configured to receive the output voltage sensed from the output node and a reference voltage, and output a second current signal corresponding to the second voltage control signal according to the fluctuation in the output voltage; and
a trans-resistance amplifier configured to convert an added-up signal of the first current signal and the second current signal into a voltage control signal for compensating the output voltage.

16. The LDO regulator of claim 1, wherein the LDO regulator is further configured to reduce a ripple voltage in the output voltage based on the first compensation and the second compensation.

17. A low-dropout (LDO) regulator comprising:
a time domain loop block configured to convert a fluctuation in an output voltage sensed from an output node of the LDO regulator into a time domain signal and repeatedly perform first compensation for the fluctuation in the output voltage, based on a clock signal; and
an analog loop block configured to perform second compensation for the fluctuation in the output voltage, regardless of the clock signal,
wherein the time domain loop block and the analog loop block are connected in parallel or in series, and
wherein the LDO regulator is configured to reduce the fluctuation in the output voltage, based on the first compensation and the second compensation.

18. The LDO regulator of claim 17, wherein the time domain loop block and the analog loop block are configured to share a pass transistor connected between a power supply line and the output node,
wherein the time domain loop block comprises:
a voltage-to-time converter configured to convert the fluctuation in the output voltage into the time domain signal, based on the clock signal; and
a time-to-voltage converter configured to output a first voltage control signal based on the time domain signal,
wherein the analog loop block comprises an analog amplifier configured to output a second voltage control signal based on the first voltage control signal and the output voltage, and
wherein the pass transistor configured to drive the output voltage based on the second voltage control signal.

19. A low-dropout (LDO) regulator comprising:
a time domain loop block configured to perform first compensation for a fluctuation in an output voltage on an output node of the LDO regulator based on a clock signal and the output voltage; and
an analog loop block configured to perform second compensation for the fluctuation in the output voltage based on the output voltage regardless of the clock signal,
wherein the LDO regulator is configured to perform the first compensation through a time domain loop and the second compensation through an analog loop, and
wherein when a fluctuation in the output voltage occurs, the second compensation by the analog loop is performed earlier than the first compensation by the time domain loop such that the LDO regulator reduces the fluctuation in the output voltage.

20. The LDO regulator of claim 19, wherein the time domain loop block and the analog loop block are connected in parallel or in series.

* * * * *